United States Patent [19]

Zampiello

[11] 4,208,242
[45] Jun. 17, 1980

[54] METHOD FOR COLOR TELEVISION PICTURE TUBE APERTURE MASK PRODUCTION EMPLOYING PVA AND REMOVING THE PVA BY PARTIAL CARMELIZING AND WASHING

[75] Inventor: Pamela Zampiello, Boxborough, Mass.

[73] Assignee: GTE Laboratories Incorporated, Waltham, Mass.

[21] Appl. No.: 951,908

[22] Filed: Oct. 16, 1978

[51] Int. Cl.² .......................... C23F 1/02; G03C 5/00
[52] U.S. Cl. .................... 156/659.1; 134/2; 134/20; 156/904; 430/29; 430/323; 430/329; 430/511
[58] Field of Search ............... 156/659, 904, 356, 668; 96/36, 36.1; 134/2, 40, 19, 20

[56] References Cited

U.S. PATENT DOCUMENTS

| | | | |
|---|---|---|---|
| 3,081,203 | 3/1963 | Beuscher | 134/40 |
| 3,175,907 | 3/1965 | Fishman | 156/904 |
| 3,415,648 | 12/1968 | Certa | 96/36 |
| 3,672,893 | 6/1972 | Robinder et al. | 96/36.1 |
| 3,767,490 | 10/1973 | Alberts | 156/668 |
| 3,770,434 | 11/1973 | Law | 96/36.1 |
| 3,796,603 | 3/1974 | Cox et al. | 134/2 |
| 3,980,587 | 9/1976 | Sullivan | 134/40 |
| 4,018,627 | 4/1977 | Polata | 156/659 |

OTHER PUBLICATIONS

An Introduction to Photofabrication using Kodak Photosensitive Resists, Eastman Kodk. Co., Rochester, N.Y., pp. 24–27, (1967).

Primary Examiner—Jerome W. Massie
Attorney, Agent, or Firm—Jerry F. Janssen

[57] ABSTRACT

A method for producing etched metal bodies, particularly color television picture tube aperture masks, comprises the steps of applying a polyvinyl alcohol photoresist film to the metal substrate, exposing the film, developing the image produced by exposure, heat hardening the developed image, acid etching the metal body, heating the body to caramelize the remaining film, and stripping the caramelized film from the metal body using an aqueous caustic stripping solution. The heat caramelization step greatly enhances the caustic strippability of heat hardened polyvinyl alcohol films from metallic surfaces.

8 Claims, 1 Drawing Figure

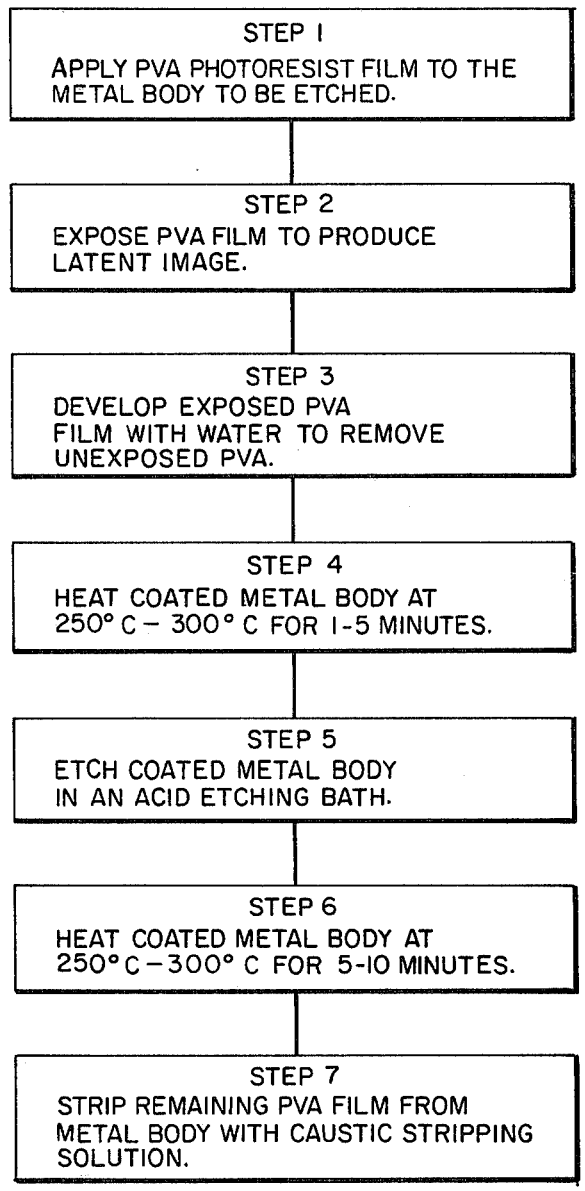

METHOD FOR COLOR TELEVISION PICTURE TUBE APERTURE MASK PRODUCTION EMPLOYING PVA AND REMOVING THE PVA BY PARTIAL CARMELIZING AND WASHING

BACKGROUND OF THE INVENTION

This invention relates to methods of producing etched patterns in metal bodies. More particularly, it is concerned with a method of fabricating color television picture tube aperture masks.

In color television picture tubes, the beams of electrons emanating from the cathodes are directed by means of electromagnetic deflection coils through the holes of an aperture mask and onto a pattern of color generating phosphors deposited on the inner surface of the picture tube face panel. The aperture mask may contain upwards of a quarter million holes which are formed by photoresist etching processes well known in the art.

In a typical process for forming a picture tube aperture mask, a sheet of thin metal which is usually unalloyed steel is first coated with a film of water soluble photoresist material. The film is then exposed through a photographic master to produce a latent aperture pattern in the film. The exposed film is developed with water to remove the unexposed photoresist. The photoresist remaining on the steel surface is next hardened to attack by aqueous acid by heating. The aperture pattern is then etched in the steel mask blank by exposing it to an acid etching bath. Following the etching step, the photoresist film remaining on the metal substrate is removed by means of an aqueous caustic stripping step.

A photoresist material to be compatible with the process described above must be (1) water soluble, (2) insolubilized to attack by water upon exposure to light, (3) insolubilized to attack by aqueous acid etching baths by heat hardening, and (4) soluble in aqueous caustic solutions after the heat hardening step.

The photoresist material most commonly employed for manufacture of picture tube aperture masks is so-called "fish glue" sensitized to light by the addition of ammonium dichromate. Fish glue is a partially hydrolyzed protein polymer derived from waste by-products of the fish processing industry. It is commercially available as an aqueous solution which is about 50% solids by weight. Fish glue varies widely from batch to batch in such properties critical to its use as a photoresist material as viscosity, drying characteristics, and response to light once sensitized. This variation in critical properties presents major problems when fish glue photoresist formulations are employed in automated or assembly line processes for aperture mask fabrication.

Dichromated polyvinyl alcohol photoresists, well known to the art, would appear to offer an attractive alternative to fish glue as a photoresist material for aperture mask production. Polyvinyl alchol, in addition to possessing most of the desired photoresist properties outlined above, is a synthetic polymer commercially available in a variety of molecular weight grades which are both uniform and consistent from one batch to the next. As a photoresist material, dichromated polyvinyl alcohol does possess one property which, nevertheless, precludes its use in existing processes for aperture mask fabrication. Heat hardened films of dichromated polyvinyl alcohol are very difficult to remove from metal surfaces using aqueous caustic stripping solutions. These films are also not easily stripped by organic solvents which, in any event, are less desirable because of their cost and associated disposal problems. Alternative stripping solutions which have been found to be effective are generally corrosive to the metal mask itself or to metallic parts of the stripping machinery.

In copending application Ser. No. 951,922 entitled "Photoresist and Method for Color Television Picture Tube Aperture Mask Production" filed concurrently herewith and assigned to the assignee of the present invention, there is described a method of overcoming the problem of the resistance to stripping of polyvinyl alcohol photoresist films by the modification of the photoresist formulation with polymeric additives.

It is therefore an object of this invention to provide a process for fabricating etched metal bodies which employs water soluble photoresist formulations which are uniformly compoundable from batch to batch.

It is a further object of this invention to provide a process for fabricating color television picture tube aperture masks which allows for the use of unmodified polyvinyl alcohol photoresist formulations.

It is still a further object of this invention to provide a process for fabricating color television picture tube aperture masks which is compatible with existing process machinery.

SUMMARY OF THE INVENTION

An improved process for producing etched metal bodies, particularly adapted to the fabrication of color television picture tube aperture masks comprises the steps of (a) coating a metal body with a film of polyvinyl alcohol photoresist, (b) exposing the coated metal body to ultraviolet light to produce a latent image in the film, (c) washing the exposed film with water to remove the unexposed polyvinyl alcohol to develop the image, (d) heating the coated metal body at about 250° C.–300° C. for 2–3 minutes to harden the developed image to attack by aqueous acid, (e) etching the coated metal body, (f) heating the etched metal body and remaining film at about 250° C.–300° C. for a period sufficient to partially carmelize the remaining film, and (g) stripping the remaining film from the metal body using an aqueous caustic stripping solution.

BRIEF DESCRIPTION OF THE DRAWING

The sole FIGURE is a schematic flow chart of the process according to the present invention.

For a better understanding of the present invention, together with other and further objects, advantages and capabilities thereof, reference is made to the following disclosure and appended claims in connection with the above-described drawing.

DETAILED DESCRIPTION

As shown in the sole accompanying FIGURE, the process according to the present invention comprises a first step of applying a film of photoresist to the metal body which is to be etched.

The preferred photoresist formulation for the process according to the present invention is a water solution of polyvinyl alcohol (PVA) sensitized with ammonium dichromate. The ratio of PVA solids to solid ammonium dichromate is generally kept to about 10:1. Since the water serves merely as a vehicle for applying the photoresist film to the metal substrate and is allowed to evaporate after the photoresist is applied, the exact amount of water in the formulation is not critical. Water comprises a component of the photoresist in amounts sufficient to produce a free-flowing solution which forms a uniform film of the desired thickness on the metal body. Water-soluble organic solvents such as low molecular weight alcohols may be added in small amounts as desired to enhance the flow and film-forming properties of the photoresist formulation.

The photoresist solution is applied to the metal body of any of the well-known techniques in the art which include dipping, spraying, painting, flow-coating, or spin-coating. Following application of the photoresist to the metal body, the water and any volatile solvent additives which the formulation may contain are allowed to evaporate to produce a dried photoresist film.

The second step of the process of the present invention is the exposure of the dried film to ultraviolet light through a patterned photographic master to produce a latent image in the film. The exposure parameters of time and source intensity are established for a given case by methods well known to a practitioner of the photographic arts.

Following exposure, the photoresist film is developed with water to convert the latent pattern image in the photoresist into a real image. Regions of the dichromated PVA film which were not exposed to the ultraviolet light remain water soluble and are removed from the metal body in this water development step. The preferred method of carrying out this development step is spraying the exposed, coated metal body with a fine mist of water. The erosive action of the spray mist aids in the rapid development of the image.

Following development of the image, the PVA film pattern remaining on the metal body is hardened, or further insolubilized and made acid resistant, by heating. While the time of heating and temperature employed can be varied to suit limits imposed by a particular automated process, the preferred range is between about 250° C. and about 300° C. for a period of 1 to 5 minutes. Optimum conditions have been found to be at about 287° C. for 2–3 minutes.

The heat hardening, or insolubilization, of dichromated PVA films is thought to result from thermally induced oxidation-reduction and cross-linking. The extent of cross-linking of the polymer which occurs in the film as a result of heating is considerably greater than that which results from exposure to light, and is sufficient to render the film resistant to attack by either acidic or basic aqueous solutions.

In the next step, the metal body is etched by exposure to an acidic etching bath. Suitable etchants include dilute aqueous acid solutions which have a significantly faster rate of attack on the metal body than on the hardened PVA film. In the particular case of mild steel used in fabricating color television picture tube aperture masks, concentrated ferric chloride containing some hydrochloric acid is the preferred etchant.

Following the etching step the metal body is heated at a temperature of between about 250° C. and about 300° C. for a period sufficient to partially caramelize the film remaining on the etched body. The preferred conditions are heating at about 287° C. for about 5–10 minutes. By using the same temperature as in the earlier heat-hardening step, the possibility exists of employing the same oven or heating apparatus for both that step and the caramelization step.

As used throughout the specification and claims, the terms "caramelize" and "caramelization" refer to the partial termal decomposition of the PVA film to produce a slightly browned material without proceeding to a state where full carbonization has occurred. The process is akin to that involved in the partial decomposition of sugar, where the term has its wider usage.

The caramelization step alters the PVA film remaining on the metal body and causes it to begin to flake and peel away from the metal surface. The effect is thought to result from the combination of exposure of the film to the etchant and the subsequent thermal decomposition. Any contribution to the effect by exposure to the acid must be slight however, because it has been observed that PVA films which are not subjected to the caramelization heating step according to the present invention are quite adherent to metal substrate surfaces.

The final step in the process according to the present invention is the stripping of the caramelized PVA film from the etched metal body using dilute aqueous caustic. A variety of caustic solutions may be employed for this step, including aqueous solutions of sodium hydroxide potassium hydroxide, sodium or potassium carbonate and the like. Cost, however, dictates the use of aqueous sodium hydroxide solution; concentrations of up to about 5 molar are effective, and about 3 molar is preferred.

As in the earlier water development step, this stripping step is preferably carried out by impinging a spray of the caustic stripping solution on the workpiece to take advantage of the erosive action of the spray to aid in removing the caramelized film.

To enable one skilled in the art to practice the invention, the following Examples are provided, although the Examples are not to be viewed as limiting the scope of the present invention, but merely illustrative thereof.

EXAMPLES

In the following Examples, the photoresist formulation comprised a 10:1 mixture by weight of Monsanto Gelvatol 1-30 PVA and ammonium dichromate in water. "Gelvatol 1-30," available from Monsanto Chemical Company, 800 North Lindbergh Avenue, St. Louis, Mo 63166, is a polymer of vinyl acetate in which 98.5–100% of the acetate groups have been removed by hydrolysis to produce a polymer of "vinyl alcohol" having an average molecular weight of about 14,000.

The photoresist material was deposited as a thin film on a 2 inch×2 inch (5.08 cm×5.08 cm) piece of 6.8 mil (0.017 cm) unalloyed mild steel of the type commonly employed in the production of picture tube aperture masks. The steel pieces were precleaned by washing in soapy water, followed by consecutive rinses with water, 3% nitric acid solution, and water.

The film was applied to the metal by spinning at about 1000 rpm to centrifugally distribute the photoresist uniformly over the metal surface. The coated metal pieces were air dried, and then exposed for up to five minutes through a patterned master to produce a latent image in the film. A high pressure mercury vapor lamp was used as the source of ultraviolet light for the exposure step.

Following exposure, the latent images produced on the coated metal pieces were developed in a water spray for one minute. Next, the pieces were heated at 287° C. for three minutes.

The metal pieces were then etched in concentrated ferric chloride containing some hydrochloric acid to produce an etched pattern in the metal.

Following the etching step, the metal workpiece of a first example and that of a second example were treated to different subsequent process steps for the purposes of comparison.

The etched workpiece of the first example, serving as an experimental control, was placed in a rapidly stirred 3 molar sodium hydroxide solution maintained at 82° C. Under these conditions, the time required for removal of the remaining PVA film on the metal workpiece was in excess of 24 hours.

The etched workpiece of the second example was heated at 287° C. for 6 minutes to partially caramelize the PVA film remaining on the metal. Following this heat treatment, the strippability of the caramelized film was tested as described for the first example above. The time required for removal of the caramealized PVA film from the metal workpiece was about six minutes. The comparative times required for stripping the two films indicates that the second heating step employed in the case of the second example greatly enhances strippability of PVA films from metallic surfaces when caustic stripping solutions are employed.

While there has been shown and described what is at present believed to be the preferred embodiment of the invention, it will be obvious to those skilled in the art that various changes and modifications may be made therein without departing from the scope of the invention as defined by the appended claims.

What is claimed is:

1. A method of forming an etched pattern in a metal body comprising the steps of:
   (a) coating the metal body with a film of a photoresist composition comprising polyvinyl alcohol and ammonium dichromate,
   (b) exposing the coated metal body to ultraviolet light to produce a latent image in the film,
   (c) washing the exposed coated metal body to remove therefrom the unexposed film,
   (d) heating the metal body and remaining film at a temperature of from about 250° C. to about 300° C. for a period sufficient to harden the remaining film to attack by aqueous acid,
   (e) etching the coated metal body,
   (f) heating the etched metal body and remaining film at a temperature of between about 250° C. and 300° C. for a period sufficiently to partially caramelize the retaining film, and
   (g) washing the coated etched metal body to remove the partially caramelized film.

2. The method of claim 1 wherein said photoresist comprises an aqueous solution of about 10 parts by weight polyvinyl alcohol solids to 1 part by weight ammonium dichromate.

3. The method of claim 1 wherein said second washing step (g) is carried out using an aqueous caustic solution.

4. The method of claim 3 wherein said aqueous caustic solution comprises about 3 to 5 molar sodium hydroxide solution.

5. The method of claim 2 wherein said first heating step (d) is carried out at a temperature between about 250° C. and about 300° C. for a period of from 2 to 3 minutes.

6. The method of claim 5 wherein said first heating step is carried out at a temperature of about 287° C.

7. The method of claim 2 wherein said second heating step (f) is carried out at a temperature between about 250° C. and about 300° C. for a period of from 5 to 10 minutes.

8. The method of claim 7 wherein said second heating step is carried out at a temperature of about 287° C.

* * * * *